United States Patent
Kim

(10) Patent No.: US 8,625,330 B2
(45) Date of Patent: Jan. 7, 2014

(54) NONVOLATILE MEMORY APPARATUS AND WRITE CONTROL METHOD THEREOF

(75) Inventor: Kyu Sung Kim, Ichon-si (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 23 days.

(21) Appl. No.: 13/331,196

(22) Filed: Dec. 20, 2011

(65) Prior Publication Data
US 2013/0103883 A1    Apr. 25, 2013

(30) Foreign Application Priority Data
Oct. 20, 2011  (KR) .................. 10-2011-0107630

(51) Int. Cl.
G11C 11/00     (2006.01)
(52) U.S. Cl.
USPC ........................................................ 365/148
(58) Field of Classification Search
USPC ........................................................ 365/148
See application file for complete search history.

(56) References Cited

U.S. PATENT DOCUMENTS

| | | | | |
|---|---|---|---|---|
| 8,050,083 B2* | 11/2011 | Ha et al. | | 365/163 |
| 8,355,291 B2* | 1/2013 | Kim et al. | | 365/222 |
| 8,456,947 B2* | 6/2013 | Sandhu | | 365/242 |
| 2009/0201721 A1* | 8/2009 | Ha et al. | | 365/163 |
| 2010/0321987 A1* | 12/2010 | Lung et al. | | 365/163 |
| 2011/0240946 A1* | 10/2011 | Miao et al. | | 257/3 |
| 2012/0063196 A1* | 3/2012 | Kim et al. | | 365/148 |
| 2012/0153119 A1* | 6/2012 | Patil et al. | | 250/200 |
| 2012/0320670 A1* | 12/2012 | Kau | | 365/163 |

FOREIGN PATENT DOCUMENTS

| KR | 10-0809333 | 3/2008 |
|---|---|---|
| KR | 10-2010-0035445 | 4/2010 |
| KR | 10-1069680 | 10/2011 |

* cited by examiner

*Primary Examiner* — Hoai V Ho
*Assistant Examiner* — Jay Radke
(74) *Attorney, Agent, or Firm* — IP & T Group LLP

(57) ABSTRACT

A nonvolatile memory apparatus includes a memory cell array, and a write operation controller configured to verify a write operation by comparing input data of the write operation controller to cell data written into the memory cell array, measure a resistance value after a first time is elapsed, and determine whether or not to re-perform the write operation according to the measured resistance value.

18 Claims, 2 Drawing Sheets

NONVOLATILE MEMORY APPARATUS AND WRITE CONTROL METHOD THEREOF

CROSS-REFERENCES TO RELATED APPLICATION

The present application claims priority under 35 U.S.C. §119(a) to Korean application number 10-2011-0107630, filed on Oct. 20, 2011, in the Korean Intellectual Property Office, which is incorporated herein by reference in its entirety as set forth in full.

BACKGROUND

1. Technical Field

The present invention relates to a nonvolatile memory apparatus, and more particularly, to a write control method of a nonvolatile memory apparatus.

2. Related Art

A useful feature of a nonvolatile memory apparatus is low power consumption, and a nonvolatile memory apparatus that does not perform a refresh operation may consume less power. A phase-change random access memory (PRAM), which is a nonvolatile memory apparatus that does not perform a refresh operation, applies an electrical pulse to a phase change layer formed of a chalcogenide compound and stores data using a resistance difference between an amorphous state and a crystal state. The phase change layer may include a chalcogenide compound such as Ge2Sb2Te5 (GST). Here, the amorphous state (or reset state) may be obtained by applying a pulse current to a memory cell during a designated time, and the crystal state (or set state) may be obtained by applying a pulse current during a longer time than the designated time.

The GST of the PRAM has its own physical characteristics, and a representative example of the physical characteristic is resistance drift. The resistance drift refers to a phenomenon where the resistance of GST, which is physically and chemically unstable, increases with time while the GST is electrically stabilized. The resistance drift becomes prominent in the amorphous state.

The resistance drift exhibits an exponential function characteristic with respect to time, and the exponential function has a random variable within the range of a designated constant, regardless of a unique characteristic of a phase-change cell.

However, when the random variable of the exponential function is significantly changed, the resistance change is increased. Accordingly, the resistance value may be increased after a constant time passes, unlike when an initial write operation is performed.

As such, when the resistance value is significantly changed after a constant time passes, the reliability of a nonvolatile memory apparatus may be reduced.

SUMMARY

Exemplary embodiments of the present invention relate to a nonvolatile memory apparatus and a write control method thereof, which are capable of increasing reliability of the nonvolatile memory apparatus by improving a write operation.

In one embodiment of the present invention, a nonvolatile memory apparatus includes: a memory cell array; and a write operation controller configured to verify a write operation by comparing input data of the write operation controller to cell data written into the memory cell array, measure a resistance value after a first time is elapsed, and determine whether or not to re-perform the write operation according to the measured resistance value.

In another embodiment of the present invention, a nonvolatile memory apparatus includes: a memory cell array; a write operation verification reader configured to verify whether or not input data provided to the write operation controller is identical to cell data written into the memory cell array; and a write operation controller configured to verify a write operation by comparing the data read by the write operation verification reader to the input data, calculate a first reference resistance value corresponding to a first time, compare the first reference resistance value to a first measured resistance value, and determine whether or not to re-perform the write operation according to the first measured resistance value.

In another embodiment of the present invention, a write control method of a nonvolatile memory apparatus, comprising: writing data into a memory cell array when the data is inputted to the nonvolatile memory apparatus; determining whether the write operation was normally performed or not; when the write operation was normally performed, counting a first time and calculating a first reference resistance value corresponding to the first time; and when the counting reaches the first time, comparing the first reference resistance value to a first measured resistance value measured at the first time, and determining whether or not to re-perform the write operation.

BRIEF DESCRIPTION OF THE DRAWINGS

Features, aspects, and embodiments are described in conjunction with the attached drawings, in which.

DETAILED DESCRIPTION

Hereinafter, a nonvolatile memory apparatus and a write control method thereof according to the present invention will be described below with reference to the accompanying drawings through exemplary embodiments.

Figure 1:
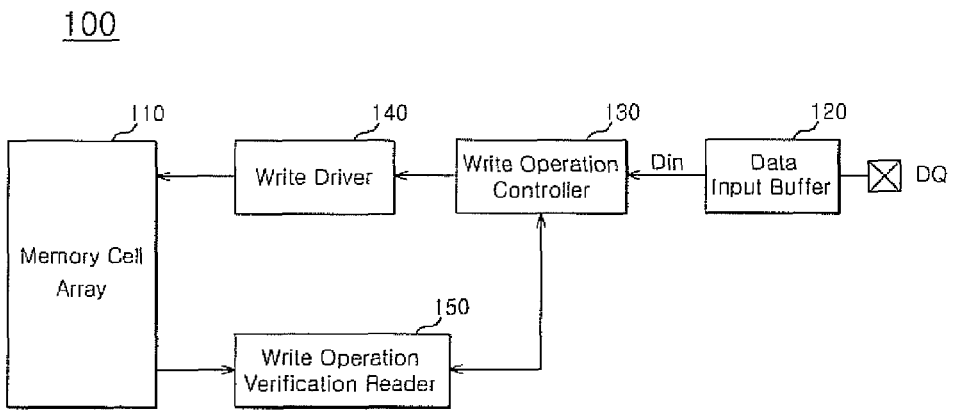
FIG. 1 is a block diagram illustrating a write control circuit of a nonvolatile memory apparatus according to an embodiment.

FIG. 1 is a block diagram illustrating a write control circuit of a nonvolatile memory apparatus according to an embodiment.

Referring to FIG. 1, the write control circuit 100 of the nonvolatile memory apparatus according to the embodiment includes a memory cell array 110, a data input buffer 120, a write operation controller 130, a write driver 140, and a write operation verification reader 150.

The memory cell array 110 includes a plurality of PRAM cells. Furthermore, each of the PRAM cells includes a switching element coupled to a word line (not illustrated) and one variable resistor (GST) coupled to a bit line (not illustrated).

The data input buffer 120 is configured to buffer data provided from an external pad DQ and provide input data Din.

The write operation controller 130 is configured to receive the input data Din inputted from the data input buffer 120 and output a write driving signal WDEN for driving the write driver 140 in response to an output signal outputted from the write operation verification reader 150.

Furthermore, when the write operation verification reader 150 determines as a verification result that the write operation was normally performed, the write operation controller 130 calculates a resistance value or voltage value with time and determines whether or not to re-perform the write operation. This operation will be described below in more detail with reference to FIGS. 2 and 3.

Meanwhile, when the write operation verification reader 150 determines as a verification result that the write operation was not normally performed, the write operation controller 130 controls the write driver 140 to apply a voltage that is increased from an initially-applied voltage and re-perform the write operation.

The write driver 140 is driven in response to the write driving signal WREN outputted from the write operation controller 130, and the write driver 140 loads the input data Din into an input/output line (not illustrated) such that the input data Din is written to the memory cell array 110. The write driver 140 applies a voltage to the memory cell array 110 according to an incremental step pulse programming (ISPP) method, which successively increases the voltage from a designated voltage.

After the write operation is performed by the write driver 140, the write operation verification reader 150 reads the data of the corresponding cell, verifies whether the read data is identical to data to be written, and provides the verification result to the write operation controller 130.

In the nonvolatile memory apparatus according to the embodiment, the write control circuit 100 includes the write operation verification reader 150 for verifying a write operation. However the present invention is not limited thereto, and a write operation may be verified by using a sense amplifier (not illustrated), which is included in a read operation circuit, to verify a write operation.

As described above, the write operation controller 130 of the write control circuit 100 in the nonvolatile memory apparatus according to the embodiment calculates a resistance value or voltage value with time when a write operation is normally performed. This process will be described in more detail with reference to FIG. 2.

Figure 2:
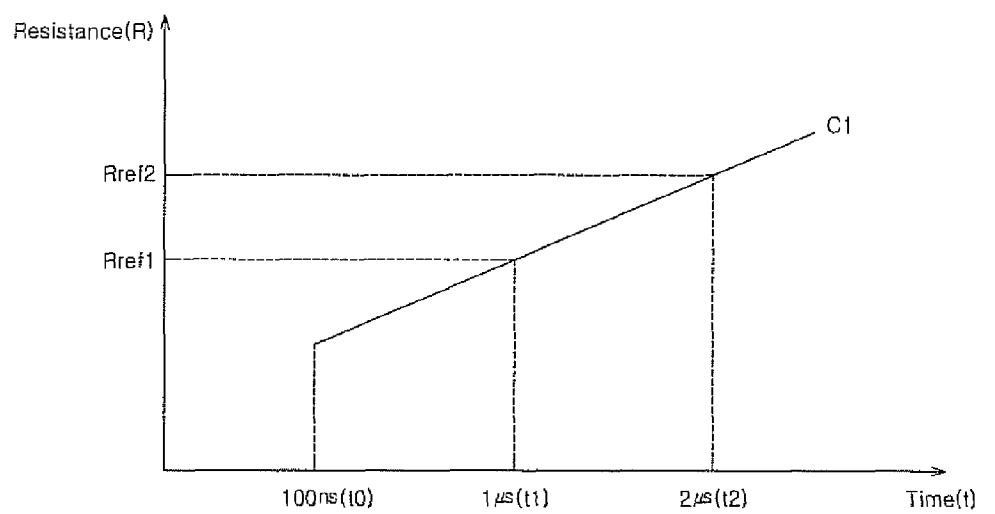
FIG. 2 is a graph illustrating a resistance change with time in the nonvolatile memory apparatus according to the embodiment.

FIG. 2 is a graph illustrating a resistance change with time in the nonvolatile memory apparatus according to the embodiment.

FIG. 2 shows an example of the resistance change with time, but the embodiment of the present invention may be applied to an example showing a voltage change with time because a voltage is proportional to resistance.

Referring to FIG. 2, the resistance of the write control circuit 100 according to the embodiment increases with time. This resistance characteristic is based on the unique characteristic of GST and is caused by the resistance drift as described above.

The write operation controller 130 of the write control circuit 100 according to the embodiment may calculate a resistance value with time, as expressed by the following equation.

$$R = R_0 \times \left(\frac{t}{t_0}\right)^v$$

Here, $R_0$ represents an initial resistance value, $t_0$ represents a time when the initial resistance value is measured, t represents a time when the next resistance value is measured, and v represents a unique constant of GST.

In addition, the initial resistance value refers to a resistance value that is measured when the write operation verification reader 150 determines as a verification result that a write operation was normally performed after the write operation.

The initial resistance $R_0$ at 100 ns is substituted in the above-described equation, and a resistance value R is calculated at 1 μs corresponding to a time of the next resistance measurement, and with the resistances measured at these exemplary times, the equation derives a first reference resistance value Rref1.

Furthermore, similar to the method that the first reference resistance value Rref1 is derived, the initial resistance $R_0$ at 100 ns is substituted in the equation, and a resistance value R is calculated at 2 μs corresponding to a time of the next resistance measurement, and with the resistances measured at these exemplary times, the equation derives a second resistance value Rref2.

As such, the reference resistance values are previously set through the above-described equation, and then each is compared to a respective resistance value that is measured in the write control circuit 100 after a respective designated time passes. When the measured resistance value is larger than the first reference resistance value, a resistance value is measured one more time after a designated time passes. Then at this time, when the measured resistance value is larger than the second reference resistance value, the write operation is re-performed.

The write control method of the nonvolatile memory apparatus according to the embodiment will be described in more detail with reference to FIG. 3.

Figure 3:
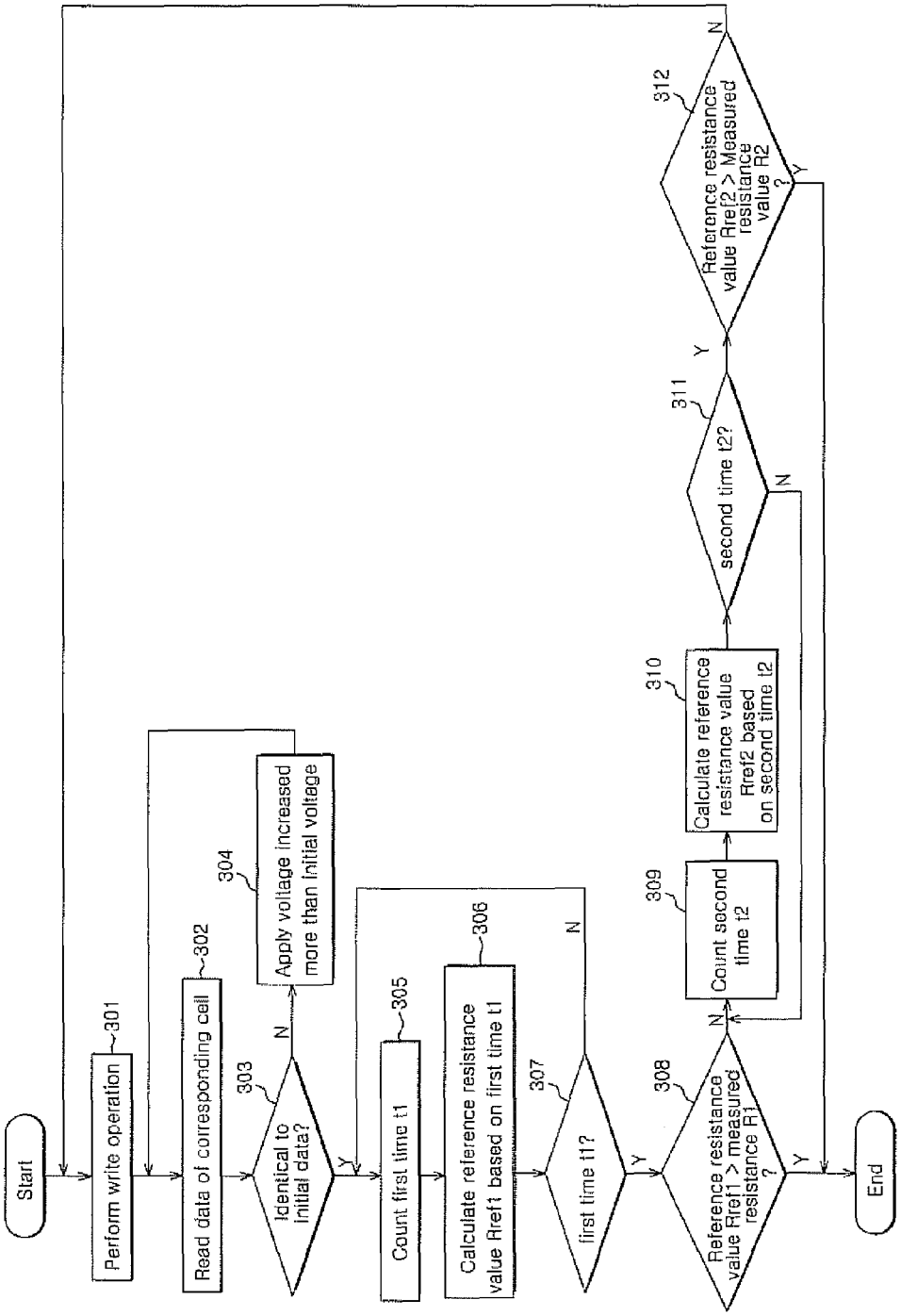
FIG. 3 is a flow chart showing a write control method of the nonvolatile memory apparatus according to the embodiment.

FIG. 3 is a flow chart showing the write control method of the nonvolatile memory apparatus according to the embodiment.

Referring to FIG. 3, when data is inputted from a circuit outside of the write control circuit 100, the write operation controller 130 controls the write driver 140 to write the data into a corresponding cell, at step S301.

The data of the corresponding cell is read through the write operation verification reader 150 at step S302, and whether or not the read data is identical to the initial data, more specifically, the written data, is determined by the write operation verification reader 150 at step S303.

As the determination result of step 303, when the read data is identical to the initial data, a first time t1 is counted at step S305. Meanwhile, when the read data is not identical to the initial data, a voltage increased more than a voltage applied to perform the write operation at the step S301 is applied at step S304. The data of the corresponding cell is read again at the step S302.

While the first time t1 is counted, a first reference resistance value Rref1 based on the first time t1 is calculated at step S306.

Subsequently, whether the counting reached the first time t1 or not is determined, at step S307. When the counting reaches the first time t1, the first reference resistance value Rref1 is compared with a resistance value R1 measured at the first time t1, at step S308. Meanwhile, when the counting did not reach the first time t1, the first time t1 is counted until the counting reaches the first time t1, at the step S305.

In regards to the comparison result between the first reference resistance value Rref1 and the measured resistance value R1, when the first reference resistance value Rref1 is larger than the measured resistance value R1, the resistance value was not significantly changed. Therefore, the nonvolatile memory apparatus determines that the reliability thereof was not influenced by the write operation, and the nonvolatile memory apparatus terminates the write operation.

Meanwhile, when the first reference resistance value Rref1 is smaller than the measured resistance value R1, the next second time t2 is counted at step S309.

While the second time t2 is counted, a second reference resistance value Rref2 based on the second time t2 is calculated at step S310.

Subsequently, whether the counting reached the second time t2 or not is determined at step S311. When the counting reaches the second time t2, the second reference resistance value Rref2 is compared with a resistance value R2 measured at the second time t2, at step S312. Meanwhile, when the counting did not reach the second time t2, the second time t2 is counted until the counting reaches the second time t2.

In regards to the comparison result between the second reference resistance value Rref2 and the measured resistance value R2, when the second reference resistance value Rref2 is larger than the measured resistance value R2, the resistance value is not significantly changed. Therefore, the nonvolatile memory apparatus determines that the reliability thereof was not influenced, and the nonvolatile memory apparatus terminates the write operation.

Meanwhile, when the second reference resistance value Rref2 is smaller than the measured resistance value R2, the reliability of the nonvolatile memory apparatus may have been affected by the write operation. Therefore, the nonvolatile memory apparatus re-performs the write operation at the step S301.

According to the embodiment of the present invention, the nonvolatile memory apparatus and the write control method thereof calculates a reference resistance value at a first time after a write verification operation, compares the calculated reference resistance value with a measured resistance value, and completes or re-performs a write operation. Therefore, a data error caused by a sudden resistance change may be prevented, and the reliability of the nonvolatile memory apparatus may be improved.

While certain embodiments have been described above, it will be understood to those skilled in the art that the embodiments described are by way of example only. Accordingly the nonvolatile memory apparatus and the write control method described herein should not be limited based on the described embodiments. Rather, the nonvolatile memory apparatus and the write control method described herein should only be limited in light of the claims that follow when taken in conjunction with the above description and accompanying drawings.

What is claimed is:

1. A nonvolatile memory apparatus comprising:
a memory cell array; and
a write operation controller configured to verify a write operation by comparing input data to the write operation controller to cell data written into the memory cell array, measure a resistance value after a preset time is elapsed, and determine whether or not to re-perform the write operation based on a comparison of the measured resistance value to a calculated reference resistance value.

2. The nonvolatile memory apparatus according to claim 1, wherein the calculated reference resistance value is calculated by using an initial resistance value, an initial time when the initial resistance value is measured, a preset measurement time, and a constant of a phase change material.

3. The nonvolatile memory apparatus according to claim 2, wherein the initial resistance value comprises a resistance value measured after the write operation verification.

4. The nonvolatile memory apparatus according to claim 2, wherein, when the calculated reference resistance value is larger than the measured resistance value, the write operation controller is configured to terminate the write operation.

5. The nonvolatile memory apparatus according to claim 2, wherein, when the calculated reference resistance value is smaller than the measured resistance value, the write operation controller is configured to re-perform the write operation.

6. The nonvolatile memory apparatus according to claim 1, wherein the write operation controller measures the resistance value of a phase-change random access memory cell.

7. A nonvolatile memory apparatus comprising:
a memory cell array;
a write operation verification reader configured to verify whether or not input data provided to the write operation controller is identical to cell data written into the memory cell array; and
a write operation controller configured to verify a write operation by comparing the data read by the write operation verification reader to the input data, calculate a first reference resistance value corresponding to a first time, compare the first reference resistance value to a first measured resistance value, and determine whether or not to re-perform the write operation according to the first measured resistance value.

8. The nonvolatile memory apparatus according to claim 7, wherein the first reference resistance value is calculated by using an initial resistance value, an initial time when the initial resistance value is measured, a first measurement time, and a constant of a phase change material.

9. The nonvolatile memory apparatus according to claim 8, wherein the initial resistance value comprises a resistance value measured after a write operation verification performed by the write operation verification reader.

10. The nonvolatile memory apparatus according to claim 8, wherein, when the first reference resistance value is larger than the first measured resistance value, the write operation controller is configured to terminate the write operation.

11. The nonvolatile memory apparatus according to claim 8, wherein, when the first reference resistance value is smaller than the first measured resistance value, the write operation controller is configured to perform a second comparison based on a second reference resistance value.

12. The nonvolatile memory apparatus according to claim 8, wherein the write operation controller measures the resistance value of a phase-change random access memory cell.

13. The nonvolatile memory apparatus according to claim 11, wherein, when the second comparison is performed, the write operation controller is configured to calculate the second reference resistance value corresponding to a second time, compare the second reference resistance value to a second measured resistance value, and determine whether or not to re-perform the write operation according to the second measured resistance value.

14. A write control method of a nonvolatile memory apparatus, comprising:
writing data into a memory cell array when the data is inputted to the nonvolatile memory apparatus;
determining whether the write operation was normally performed or not;
when the write operation was normally performed, counting a first time and calculating a first reference resistance value corresponding to the first time; and
when the counting reaches the first time, comparing the first reference resistance value to a first measured resistance value measured at the first time, and determining whether or not to re-perform the write operation.

15. The write control method according to claim 14, wherein, in the step of determining whether the write operation was normally performed or not, when the data inputted to the nonvolatile memory apparatus is identical to data obtained by reading the data written into the memory cell array, the nonvolatile memory apparatus determines that the write operation was normally performed.

16. The write control method according to claim 15, wherein, in the step of calculating the first reference resistance value corresponding to the first time, the resistance value is calculated by using an initial resistance value, an initial time when the initial resistance value is measured, a first measurement time, and a constant of a phase change material.

17. The write control method according to claim 16, wherein, in the step of determining whether or not to re-perform the write operation, when the first reference resistance value is larger than the first measured resistance value, the nonvolatile memory apparatus terminates the write operation, when the first reference resistance value is smaller than the first measured resistance value, the nonvolatile memory apparatus calculates a second reference resistance value at a second time, and subsequently compares the second reference resistance value to a second measured resistance value measured at the second time, and when the second reference resistance value is smaller than the second measured resistance value, the nonvolatile memory apparatus re-performs the write operation.

18. The write control method according to claim 17, wherein the second time is a time subsequent to the first time.

* * * * *